US010008921B2

(12) United States Patent
Cheng et al.

(10) Patent No.: US 10,008,921 B2
(45) Date of Patent: Jun. 26, 2018

(54) DRIVING POWER GENERATING CIRCUIT AND A METHOD FOR GENERATING A DRIVING POWER

(71) Applicant: Industrial Technology Research Institute, Hsinchu (TW)

(72) Inventors: Chih-Ping Cheng, Taoyuan (TW); Pei-Ling Tseng, Miaoli County (TW); Szu-Chieh Liu, New Taipei (TW); Sue-Chen Liao, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 262 days.

(21) Appl. No.: 14/944,243

(22) Filed: Nov. 18, 2015

(65) Prior Publication Data
US 2017/0070133 A1    Mar. 9, 2017

(30) Foreign Application Priority Data
Sep. 3, 2015    (TW) .............................. 104129097 A

(51) Int. Cl.
*H02H 7/00*    (2006.01)
*H02M 1/32*    (2007.01)
(Continued)

(52) U.S. Cl.
CPC ............ *H02M 1/32* (2013.01); *H02M 3/156* (2013.01); *H05B 33/089* (2013.01);
(Continued)

(58) Field of Classification Search
USPC ..................................... 361/86–87, 93.7–93.9
See application file for complete search history.

(56) References Cited

U.S. PATENT DOCUMENTS

| 7,358,685 | B2 | 4/2008 | Lee |
| 7,550,934 | B1 | 6/2009 | Deng et al. |

(Continued)

FOREIGN PATENT DOCUMENTS

| CN | 102055357 | 5/2011 |
| CN | 103874274 | 6/2014 |

(Continued)

OTHER PUBLICATIONS

"Office Action of Japan Counterpart Application," dated May 16, 2017, p. 1-p. 6, in which the listed references were cited.

(Continued)

*Primary Examiner* — Danny Nguyen
(74) *Attorney, Agent, or Firm* — JCIPRNET

(57) ABSTRACT

A driving power generating circuit configured to generate a driving power to drive a load is provided. The driving power generating circuit includes a signal generating circuit, a power converter circuit, and a sampling control circuit. The signal generating circuit is configured to output a control signal according to a feedback signal and a lock signal. The power converter circuit is electrically connected to the signal generating circuit. The power converter circuit is configured to generate the driving power according to the control signal, so as to drive the load. The sampling control circuit is electrically connected to the signal generating circuit. The sampling control circuit is configured to sample the control signal and output the lock signal according to a sampling result. A method for generating a driving power is also provided.

18 Claims, 13 Drawing Sheets

(51) Int. Cl.
*H05B 33/08* (2006.01)
*H02M 3/156* (2006.01)
*H03K 17/082* (2006.01)
*H03K 17/18* (2006.01)

(52) U.S. Cl.
CPC ... *H05B 33/0818* (2013.01); *H02M 2001/327* (2013.01); *H03K 17/0822* (2013.01); *H03K 17/18* (2013.01)

(56) References Cited

U.S. PATENT DOCUMENTS

| | | | |
|---|---|---|---|
| 8,344,661 | B2 | 1/2013 | Hsu et al. |
| 8,525,542 | B2 | 9/2013 | Xiong |
| 8,917,033 | B2 | 12/2014 | Xu et al. |
| 2004/0257833 | A1* | 12/2004 | Yang .............. H02M 3/33507 363/16 |
| 2005/0093622 | A1* | 5/2005 | Lee .................... H03F 1/523 330/10 |
| 2007/0159750 | A1 | 7/2007 | Peker et al. |
| 2011/0096574 | A1* | 4/2011 | Huang ............ H02M 3/33507 363/21.18 |
| 2013/0082603 | A1 | 4/2013 | Hsu et al. |
| 2013/0320856 | A1 | 12/2013 | Lin et al. |
| 2014/0139111 | A1 | 5/2014 | Lin et al. |
| 2014/0152180 | A1 | 6/2014 | Wolf et al. |
| 2015/0241891 | A1 | 8/2015 | Lee |
| 2016/0087422 | A1* | 3/2016 | Mourrier ............ H02H 7/0844 361/86 |
| 2016/0212808 | A1* | 7/2016 | Fujino ................ G09G 3/3406 |

FOREIGN PATENT DOCUMENTS

| | | |
|---|---|---|
| JP | S6018773 | 1/1985 |
| JP | H1014226 | 1/1998 |
| JP | 2004328713 | 11/2004 |
| JP | 2012079966 | 4/2012 |
| TW | I315930 | 10/2009 |
| TW | 201029513 | 8/2010 |

OTHER PUBLICATIONS

Chia-Lin Chiu, et al., "A High Accuracy Current-Balanced Control Technique for LED Backlight," 2008 IEEE Power Electronics Specialists Conference, Jun. 15-19, 2008, pp. 4202-4206.

Chun-Yu Hsieh, et al., "Efficienct LED Driver with an Adaptive Reference Tracking Technique," 16th IEEE International Conference on Electronics, Circuits, and Systems, ICECS 2009, Dec. 13-16, 2009, pp. 291-294.

Rafael A. Pinto, et al., "Compact Lamp Using High-Brightness LEDs," IEEE Industry Applications Society Annual Meeting, IAS '08, Oct. 5-9, 2008, pp. 1-5.

C.-C. Chen, et al., "LED Back-Light Driving System for LCD Panels," Twenty-First Annual IEEE Applied Power Electronics Conference and Exposition, APEC '06, Mar. 19-23, 2006, pp. 381-385.

Hua Yang, et al., "Design of a Digital LED Driver with Auto-Identifying Open Strings," 2012 IEEE 7th International Power Electronics and Motion Control Conference—ECCE Asia, Jun. 2-5, 2012, pp. 1617-1620.

Xu Dianguo, et al., "Study of Digital LED Driving Technology based on Auto-Identifying Open Strings in LEDs Array," 37th Annual Conference on IEEE Industrial Electronics Society, IECON 2011, Nov. 7-10, 2011, pp. 2964-2968.

"Office Action of Taiwan Counterpart Application", dated Apr. 25, 2018, p. 1-p. 7, in which the listed reference was cited.

* cited by examiner

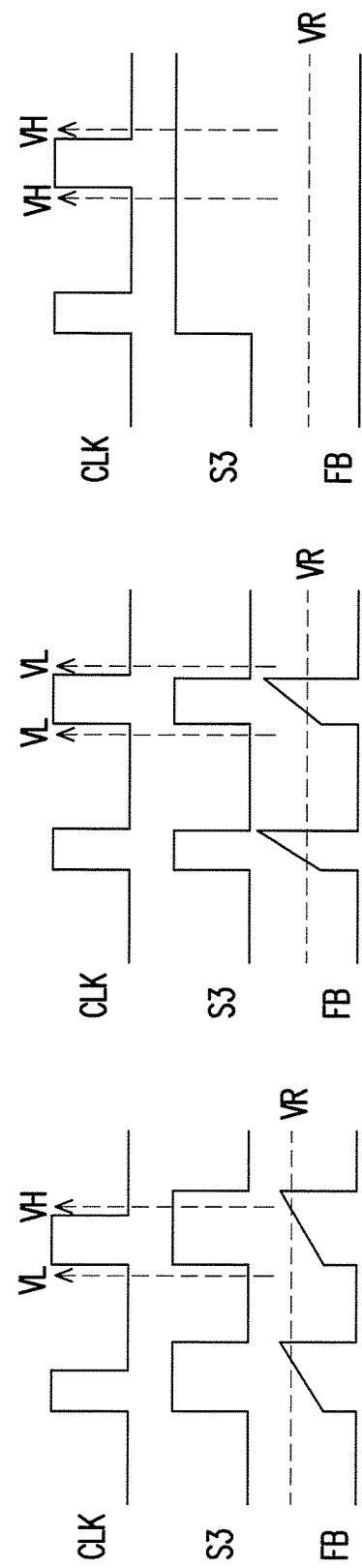

DRIVING POWER GENERATING CIRCUIT AND A METHOD FOR GENERATING A DRIVING POWER

CROSS-REFERENCE TO RELATED APPLICATION

This application claims the priority benefit of Taiwan application serial no. 104129097, filed on Sep. 3, 2015. The entirety of the above-mentioned patent application is hereby incorporated by reference herein and made a part of this specification.

TECHNICAL FIELD

The disclosure relates to a driving power generating circuit and a method for generating a driving power.

BACKGROUND

In general, an electronic apparatus often includes a driving power generating circuit for generating a driving power to drive a load of the electronic apparatus, and thereby the load is able to execute corresponding operative functions. The driving power generating circuit may not function normally due to abnormal electrical conditions of the load. For instance, since light-emitting devices in an exemplary light-emitting apparatus may be an open circuit or a short circuit, the operating temperature of the driving power generating circuit may be excessively high, or the driving power generated by the driving power generating circuit is not configured to drive the load. Hence, as long as the load is on the abnormal electrical conditions, the overly high operating temperature may burn down the driving power generating circuit. According to the related art, an additional voltage may be supplied to the driving power generating circuit, and the electrical conditions of the load may be detected by comparing variations in the voltage. Said technique may, however, expand the chip area of the driving power generating circuit and increase the power consumption of the driving power generating circuit.

SUMMARY

The disclosure provides a driving power generating circuit and a method for generating a driving power, whereby an electrical condition of a load may be detected to determine whether to generate the driving power or not.

One of the exemplary embodiments is directed to a driving power generating circuit configured to generate a driving power to drive a load. The driving power generating circuit includes a signal generating circuit, a power converter circuit, and a sampling control circuit. The signal generating circuit is configured to output a control signal according to a feedback signal and a lock signal. The power converter circuit is electrically connected to the signal generating circuit. The power converter circuit is configured to generate the driving power according to the control signal, so as to drive the load. The sampling control circuit is electrically connected to the signal generating circuit. The sampling control circuit is configured to sample the control signal and output the lock signal according to a sampling result.

One of the exemplary embodiments is directed to a method for generating a driving power to drive a load. The method includes: outputting a control signal according to a feedback signal and a lock signal, sampling the control signal and outputting the lock signal according to a sampling result, and generating the driving power according to the control signal to drive the load.

According to the exemplary embodiments provided herein, the sampling control circuit is configured to sample the control signal and output the lock signal to the signal generating circuit or the processor circuit according to the sampling result. Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 3 schematically illustrates waveforms of signals of a driving power generating circuit while a load of the driving power generating circuit provided in the exemplary embodiment as shown in FIG. 2 normally functions.

FIG. 4 schematically illustrates waveforms of signals of a driving power generating circuit while a load of the driving power generating circuit provided in the exemplary embodiment as shown in FIG. 2 is a short circuit.

FIG. 5 schematically illustrates waveforms of signals of a driving power generating circuit while a load of the driving power generating circuit provided in the exemplary embodiment as shown in FIG. 2 is an open circuit.

DETAILED DESCRIPTION OF DISCLOSED EMBODIMENTS

Several embodiments are provided below to describe the disclosure; however, the disclosure should not be limited to the embodiments given herein. The embodiments described below can be combined with each other if deemed proper. The word "couple" in the description and claims may refer to any direct or indirect connection. For instance, in the description and claims, if a first apparatus is coupled to a second apparatus, it means that the first apparatus may be directly connected to the second apparatus or may be indirectly connected to the second apparatus through another apparatus or by another connection means. In addition, the term "signal" may stand for at least one current, voltage, electric charge, temperature, data, or any other signal or signals.

Figure 1:
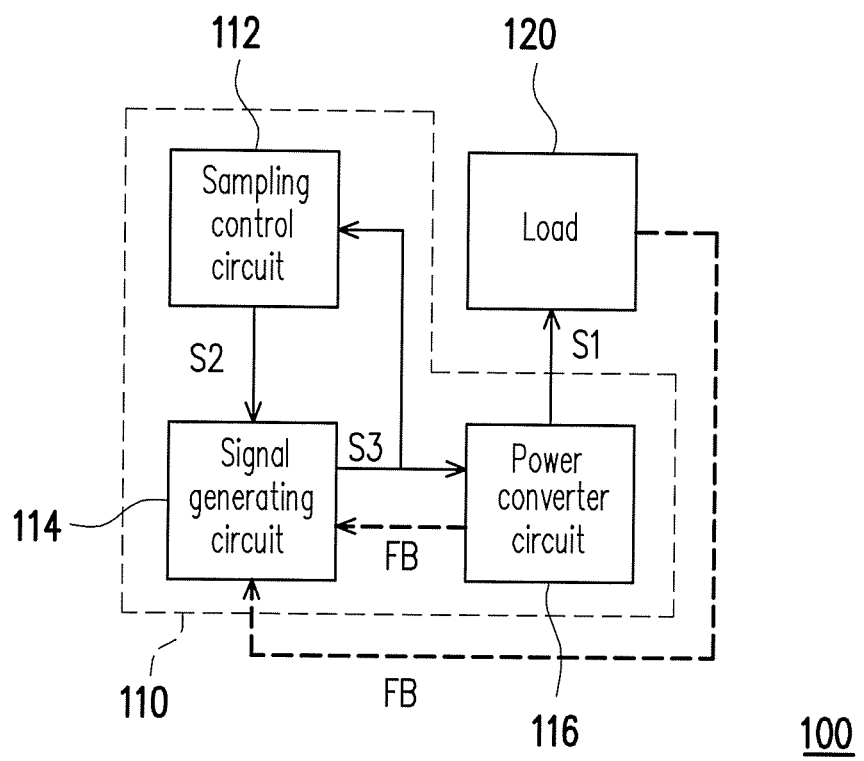
FIG. 1 is schematic view of an electronic apparatus according to an exemplary embodiment.

FIG. 1 is schematic view of an electronic apparatus according to an exemplary embodiment. With reference to FIG. 1, in the present exemplary embodiment, the electronic apparatus 100 includes a driving power generating circuit 110 and a load 120. The load 120 is electrically connected to the driving power generating circuit 110. The driving power generating circuit 110 is configured to generate a driving power S1, so as to drive the load 120 to perform corresponding operative functions. In the present exemplary embodiment, the driving power generating circuit 110 may selectively decide whether to generate the driving power S1 to drive the load 120 according to the electrical condition of the load 120, e.g., whether the load 120 is an open circuit or a short circuit or functions normally. In the exemplary embodiment of the invention, a short circuit is an electrical circuit that allows a current to travel along an unintended path, often where essentially no (or a very low) electrical impedance is encountered. The electrical opposite of a short circuit is an "open circuit", which is an infinite resistance between two nodes.

In particular, the driving power generating circuit 110 provided herein includes a signal generating circuit 114, a power converter circuit 116, and a sampling control circuit 112 in the present exemplary embodiment. The signal generating circuit 114 is configured to output a control signal S3 to the power converter circuit 116 according to a feedback signal FB and a lock signal S2. The feedback signal FB is a sensing signal generated by a current sensor which is located in the power converter circuit 116 and senses electric currents or an electrical signal provided by the load 120, for instance, and the feedback signal GB is fed back to the signal generating circuit 114. However, the disclosure is not limited thereto. In the present exemplary embodiment, the signal generating circuit 114 is, for instance, a pulse width modulating (PWM) circuit or another similar apparatus capable of generating a PWM signal as the control signal S3 and outputting the control signal S3 to the power converter circuit 116, so as to control the conduction states of the switch in the power converter circuit 116.

In the present exemplary embodiment, the power converter circuit 116 described herein is electrically connected to the signal generating circuit 114. The power converter circuit 116 is configured to provide the feedback signal FB and generate the driving power S1 according to the control signal S3, so as to drive the load 120. In the present exemplary embodiment, the power converter circuit 116 includes a buck converter, a boost converter, a flyback converter, or a combination thereof, for instance, which should however not be construed as a limitation to the disclosure. Besides, in the present exemplary embodiment, the driving power S1 may be a driving signal in form of electric current or voltage in response to the manner of designing the power converter circuit 116 or the load 120, and the disclosure is not limited thereto.

In the present exemplary embodiment, the sampling control circuit 112 is electrically connected to the signal generating circuit 114. The sampling control circuit 112 is configured to sample the control signal S3, so as to determine the electrical condition of the load 120, i.e., whether the load 120 is an open circuit or a short circuit or functions normally. The sampling control circuit 112 then outputs the lock signal S2 to the signal generating circuit 114 according to a sampling result S4, so as to control the signal generating circuit 114 to determine whether to output the control signal S3 to the power converter circuit 116. Hence, in the present exemplary embodiment, the signal generating circuit 114 controls the power converter circuit 116 to stop operation according to the control signal S3, and thereby the power converter circuit 116 does not generate the driving power S1. In an exemplary embodiment, the lock signal S2 acts as a warning signal, for instance, and the sampling control circuit 112 outputs the lock signal S2 to a processor circuit to indicate whether the load 120 is an open circuit or a short circuit.

Hence, the driving power generating circuit 110 described herein may selectively decide whether to generate the driving power S1 to drive the load 120 according to the electrical condition of the load 120, e.g., whether the load 120 is an open circuit or a short circuit or functions normally. Thereby, the driving power generating circuit 110 which continuously functions when the load 120 is an open circuit or a short circuit can be prevented from being overheated or burned down.

In the present exemplary embodiment, the load 120 includes a display apparatus or a light-emitting apparatus, e.g., a light-emitting diode or an organic light-emitting diode, for instance; however, the disclosure is not limited thereto. In the following embodiments, the load 120 exemplarily includes a display apparatus or a light-emitting apparatus, e.g., a light-emitting diode or an organic light-emitting diode; however, the type of the load 120 is not limited herein.

Figure 2:
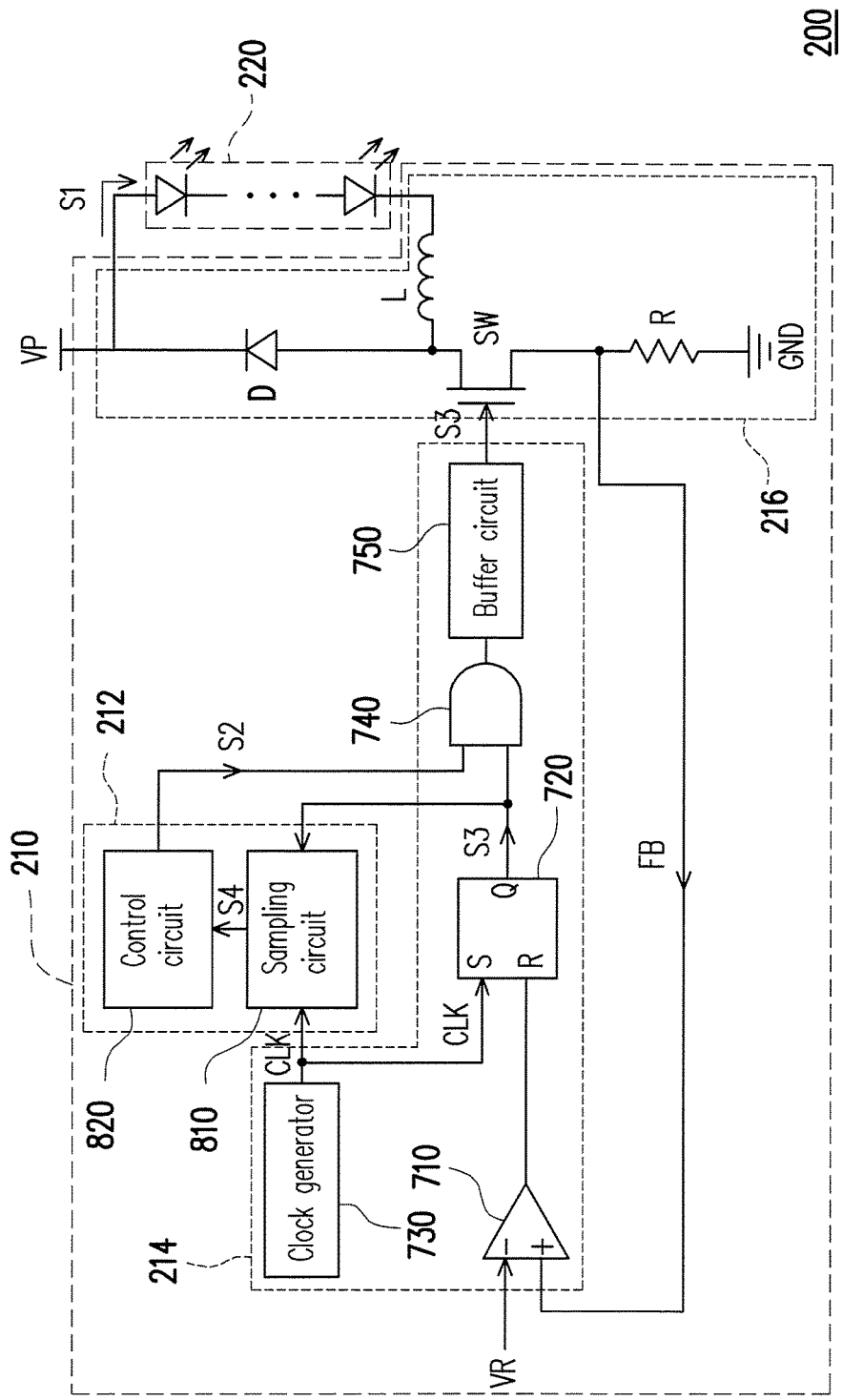
FIG. 2 is schematic view of an electronic apparatus according to another exemplary embodiment.

FIG. 2 is schematic view of an electronic apparatus according to another exemplary embodiment. FIG. 3 to FIG. 5 schematically illustrate waveforms of signals of the driving power generating circuit while the load of the driving power generating circuit provided in the exemplary embodiment as shown in FIG. 2 normally functions. With reference to FIG. 2 to FIG. 5, in the present exemplary embodiment, the electronic apparatus 200 includes a driving power generating circuit 210 and a load 220. The driving power generating circuit 210 includes a signal generating circuit 214, a power converter circuit 216, and a sampling control circuit 212. In the present embodiment, the load 220 is a string of light-emitting diodes for instance, and this should by no means restrict the scope of protection provided in the disclosure.

Specifically, FIG. 3 schematically illustrates waveforms of signals of the driving power generating circuit while the load of the driving power generating circuit provided in the exemplary embodiment as shown in FIG. 2 normally functions. With reference to FIG. 2 and FIG. 3, in the present exemplary embodiment, the power converter circuit 216 is configured to perform power conversion on the power voltage VP, so as to generate the driving power S1 to drive the load 220. In the present exemplary embodiment, an inductor L, a diode D, and the load 220 constitute an electrical loop coupled between the power voltage VP and a switch SW. A resistor R is coupled between the switch SW and the ground voltage GND.

During a normal operation, i.e., if the load 220 is neither an open circuit nor a short circuit, the power voltage VP is converted into the driving power S1 when the switch SW is switched on, so as to drive the load 220; besides, a portion of energy is stored in the inductor L. When the switch SW is switched off, the inductor L provides the driving power S1 to the load 220 through the diode D. In the present exemplary embodiment, the resistor R is coupled between the switch SW and the ground voltage GND. The resistor R is, for instance, an electric current sensor for sensing the amount of the electric current of the driving power S1 as the feedback signal FB, and the feedback signal FB is output to the signal generating circuit 214. The waveform of the feedback signal FB is shown in FIG. 3.

In the present exemplary embodiment, the signal generating circuit 214 is configured to output the control signal S3 according to the feedback signal FB and the lock signal S2, so as to determine whether the switch SW is switched on or off. Specifically, in the signal generating circuit 214, a comparator 710 is configured to receive the feedback signal FB and a reference signal VR and compares the levels of the two signals, so as to output the comparison result to determine whether to reset an SR flip-flop 720 or not. For instance, in the present exemplary embodiment, a setting terminal S of the SR flip-flop 720 receives a clock signal CLK provided by a clock generator 730, and the waveform of the clock signal CLK is shown in FIG. 3. When the clock signal CLK is at the high level, the SR flip-flop 720 outputs the control signal at the high level through the output terminal Q. If the level of the feedback signal FB is higher than the level of the reference signal VR, the comparator 710 resets the SR flip-flop 720, and the level of the control signal S3 is reset from high to low. After that, when the clock signal CLK is again at the high level, the comparator 710 and the SR flip-flop 720 repeat said operations. In the present exemplary embodiment, the control signal S3 is output to the power converter circuit 216 through a logic circuit 740 and a buffer circuit 750, so as to determine whether the switch SW is switched on or off. For instance, in the present exemplary embodiment, the control signal S3 at the high level is configured to switch on the switch SW, and the control signal S3 at the low level is configured to switch off the switch SW. The correlation between the level of the control signal S3 and the conduction state of the switch SW is determined by the type of the switch SW, for instance. In another exemplary embodiment, the control signal S3 at the low level may be configured to switch on the switch SW, and the control signal S3 at the high level may be configured to switch off the switch SW, which should not be construed as limitations to the disclosure.

In the present exemplary embodiment, the sampling control circuit 212 is configured to sample the control signal S3 at the output terminal Q of the SR flip-flop 720, so as to determine the electrical condition of the load 220, i.e., whether the load 220 is an open circuit or a short circuit or functions normally. Specifically, the sampling control circuit 212 provided herein includes a sampling circuit 810 and a control circuit 820, for instance. The sampling circuit 810 is electrically connected to the signal generating circuit 214. The control circuit 820 is electrically connected to the sampling detection circuit 810. The sampling circuit 810 is configured to sample the control signal S3 according to the clock signal CLK and output the sampling result S4 to the control circuit 820. In the present exemplary embodiment, the sampling result S4 output by the sampling circuit 810 includes a pulse width of the control signal S3, for instance. In FIG. 3, the sampling circuit 810 samples the control signal S3 in the time sequence before and after the clock signal CLK at the high level. The reference symbols VL and VH respectively represent the sampling result S4 of the low-level control signal S3 earlier obtained by the sampling circuit 810 and the high-level control signal S3 later obtained by the sampling circuit 810, for instance. Here, the sampling result S4 indicates that the pulse width of the control signal S3 is substantially equal to the predetermined width range, and the load 220 functions normally at this time. In the present exemplary embodiment, the predetermined width range is determined according to actual circuit design demands or according to the clock signal CLK, for instance. The predetermined width range provided in an exemplary embodiment may be equal to or slightly greater than the pulse width of the clock signal CLK by 2 nanoseconds (ns), which should not be construed as a limitation to the disclosure.

According to the sampling result S4, the control circuit 820 outputs the high-level or low-level lock signal S2. In the present exemplary embodiment, the pulse width of the control signal S3 is substantially equal to the predetermined width range according to the sampling result S4; at this time, the load 220 functions normally, and the control circuit 820 outputs the high-level lock signal S2 to the logic circuit 740, for instance, such that the control signal S3 passes through the logic circuit 740 and the buffer circuit 750 and is then output to the power converter circuit 216 to determine whether the switch SW is switched on or off.

In the present exemplary embodiment, the pulse width of the control signal S3 may be greater than or less than the predetermined width range according to the sampling result S4. If the pulse width of the control signal S3 is greater than the predetermined width range, it indicates that the load 220 is an open circuit. On the contrary, if the pulse width of the control signal S3 is less than a predetermined width range, it indicates that the load 220 is a short circuit. That is, the sampling result S4 of the sampling circuit 810 includes the information of whether the pulse width of the control signal S3 is greater than, equal to, or less than the predetermined width range.

Specifically, FIG. 4 schematically illustrates waveforms of signals of a driving power generating circuit while a load of the driving power generating circuit provided in the exemplary embodiment as shown in FIG. 2 is a short circuit. With reference to FIG. 2 and FIG. 4, in the present exemplary embodiment, the load 220 is a short circuit, for instance. When the high-level control signal S3 switches on the switch SW, the waveform of the feedback signal FB is rapidly raised and goes beyond the level of the reference signal VR because the load 220 is a short circuit. At this time, the SR flip-flop 720 is reset, and thereby the level of the control signal S3 is dropped from high to low. Therefore, as shown in FIG. 4, when the sampling circuit 810 samples the control signal S3 in the time sequence before and after the clock signal CLK at the high level, the sampling result S4 lies in that the earlier-obtained control signal S3 and the later-obtained high-level control signal S3 are both at the low level. According to the sampling result S4, the pulse width of the control signal S3 is less than the predetermined width range, which indicates that the load 220 is a short circuit. The control circuit 820 then outputs the low-level lock signal S2 to the logic circuit 740, for instance, such that the logic circuit 740 masks and does not output the control signal S3, and that the switch SW is switched off. As such, the driving power generating circuit 210 that is continuously operated when the load 220 is a short circuit can be prevented from being overheated or burned down.

FIG. 5 schematically illustrates waveforms of signals of a driving power generating circuit while a load of the driving power generating circuit provided in the exemplary embodiment as shown in FIG. 2 is an open circuit. With reference to FIG. 2 and FIG. 5, in the present exemplary embodiment, the load 220 is an open circuit, for instance. When the high-level control signal S3 switches on the switch SW, the waveform of the feedback signal FB remains lower than the level of the reference signal VR because the load 220 is an open circuit. At this time, the SR flip-flop 720 is not reset, and thereby the level of the control signal S3 remains high. Therefore, as shown in FIG. 5, when the sampling circuit 810 samples the control signal S3 in the time sequence before and after the clock signal CLK at the high level, the sampling result S4 lies in that the earlier-obtained control signal S3 and the later-obtained high-level control signal S3 are both at the high level. According to the sampling result S4, the pulse width of the control signal S3 is greater than the predetermined width range, which indicates that the load 220 is an open circuit. The control circuit 820 then outputs the low-level lock signal S2 to the logic circuit 740, for instance, such that the logic circuit 740 masks and does not output the control signal S3, and that the switch SW is switched off. As such, the driving power generating circuit 210 that is continuously operated when the load 220 is an open circuit can be prevented from being overheated or burned down.

In the present exemplary embodiment, if the number of times of the pulse width of the control signal S3 being greater than or less than the predetermined width range is detected by the sampling circuit 810 as once, the control circuit 820 controls the logic circuit 740 to mask the control signal S3; however, the disclosure is not limited thereto. In an exemplary embodiment, the control circuit 820 may also control the logic circuit 740 to mask the control signal S3 if the number of times of the pulse width of the control signal being greater than or less than the predetermined width range is greater than or equal to a predetermined value according to the detection result of the sampling circuit 810. In an exemplary embodiment, if the number of times of the pulse width of the control signal S3 being greater than or less than the predetermined width range is in total greater than or equal to the predetermined value according to the detection result of the sampling circuit 810, the control circuit 820 may control the logic circuit 740 to mask the control signal S3.

Figure 6:
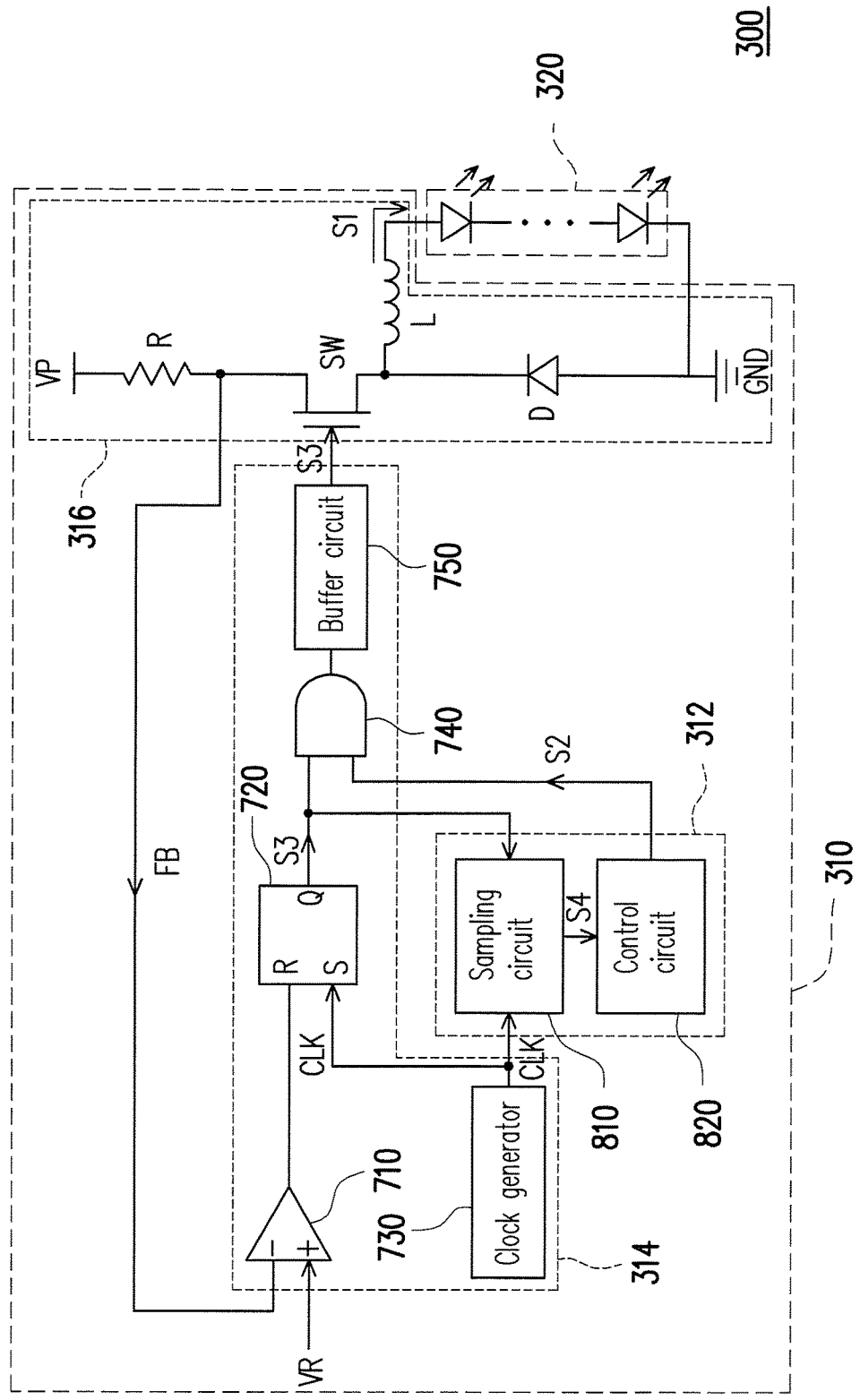
FIG. 6 is schematic view of an electronic apparatus according to another exemplary embodiment.
Figure 7:
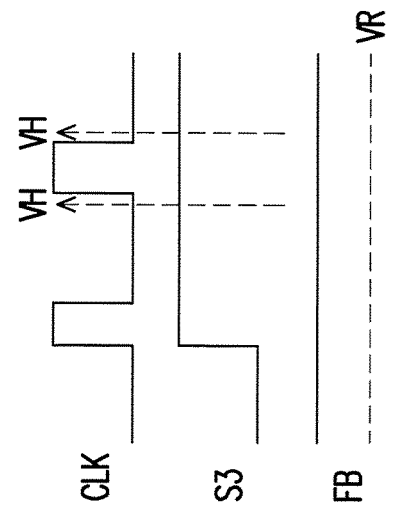
FIG. 7 schematically illustrates waveforms of signals of a driving power generating circuit while a load of the driving power generating circuit provided in the exemplary embodiment as shown in FIG. 6 normally functions.
Figure 8:
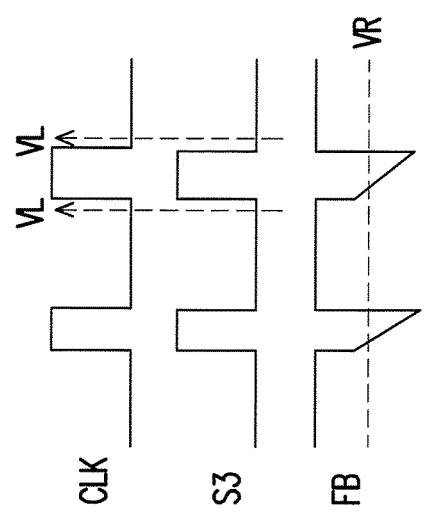
FIG. 8 schematically illustrates waveforms of signals of a driving power generating circuit while a load of the driving power generating circuit provided in the exemplary embodiment as shown in FIG. 6 is a short circuit.
Figure 9:
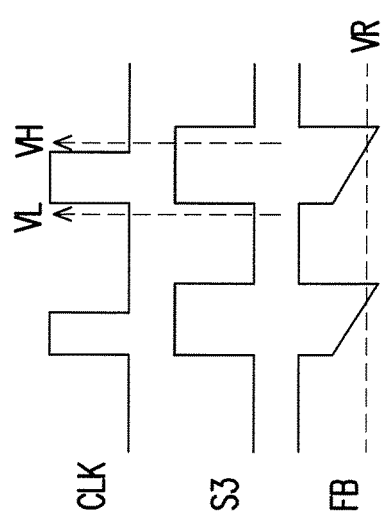
FIG. 9 schematically illustrates waveforms of signals of a driving power generating circuit while a load of the driving power generating circuit provided in the exemplary embodiment as shown in FIG. 6 is an open circuit.

FIG. 6 is schematic view of an electronic apparatus according to another exemplary embodiment. FIG. 7 to FIG. 9 schematically illustrate waveforms of signals of the driving power generating circuit while the load of the driving power generating circuit provided in the exemplary embodiment as shown in FIG. 6 normally functions. With reference to FIG. 6 to FIG. 9, the electronic apparatus 300 described in the present embodiment is similar to the electronic apparatus 200 illustrated in FIG. 2, while the main difference therebetween lies in the manner of designing the circuit structure inside the power converter circuit, for instance. Particularly, in the present exemplary embodiment, the inductor L, the light-emitting diode D, and the load 320 constitute an electrical loop coupled between the ground voltage GND and the switch SW. The resistor R is coupled between the switch SW and the power voltage VP.

For instance, FIG. 7 schematically illustrates waveforms of signals of the driving power generating circuit while the load of the driving power generating circuit provided in the exemplary embodiment as shown in FIG. 6 normally functions. With reference to FIG. 2 and FIG. 7, in the present exemplary embodiment, the comparator 710 is configured to compare the level of the feedback signal FB and the level of the reference signal VR. If the level of the feedback signal FB is lower than the level of the reference signal VR, the comparator 710 resets the SR flip-flop 720, as shown in FIG. 7.

FIG. 8 schematically illustrates waveforms of signals of a driving power generating circuit while a load of the driving power generating circuit provided in the exemplary embodiment as shown in FIG. 6 is a short circuit. With reference to FIG. 6 and FIG. 8, in the present exemplary embodiment, the load 320 is a short circuit, for instance. When the high-level control signal S3 switches on the switch SW, the waveform of the feedback signal FB is rapidly dropped and becomes lower than the level of the reference signal VR because the load 320 is a short circuit. At this time, the SR flip-flop 720 is reset, and thereby the level of the control signal S3 is dropped from high to low. Therefore, as shown in FIG. 8, when the sampling circuit 810 samples the control signal S3 in the time sequence before and after the clock signal CLK at the high level, the sampling result S4 lies in that the earlier-obtained control signal S3 and the later-obtained high-level control signal S3 are both at the low level. According to the sampling result S4, the pulse width of the control signal S3 is less than the predetermined width range, which indicates that the load 320 is a short circuit. The control circuit 820 then outputs the low-level lock signal S2 to the logic circuit 740, for instance, such that the logic circuit 740 masks and does not output the control signal S3, and that the switch SW is switched off. As such, the driving power generating circuit 310 that is continuously operated when the load 320 is a short circuit can be prevented from being overheated or burned down.

FIG. 9 schematically illustrates waveforms of signals of a driving power generating circuit while a load of the driving power generating circuit provided in the exemplary embodiment as shown in FIG. 6 is an open circuit. With reference to FIG. 6 and FIG. 9, in the present exemplary embodiment, the load 320 is an open circuit, for instance. When the high-level control signal S3 switches on the switch SW, the waveform of the feedback signal FB remains higher than the level of the reference signal VR because the load 320 is an open circuit. At this time, the SR flip-flop 720 is not reset, and thereby the level of the control signal S3 remains high. Therefore, as shown in FIG. 9, when the sampling circuit 810 samples the control signal S3 in the time sequence before and after the clock signal CLK at the high level, the sampling result S4 lies in that the earlier-obtained control signal S3 and the later-obtained high-level control signal S3 are both at the high level. According to the sampling result S4, the pulse width of the control signal S3 is greater than the predetermined width range, which indicates that the load 320 is an open circuit. The control circuit 820 then outputs the low-level lock signal S2 to the logic circuit 740, for instance, such that the logic circuit 740 masks and does not output the control signal S3, and that the switch SW is switched off. As such, the driving power generating circuit 310 that is continuously operated when the load 320 is an open circuit can be prevented from being overheated or burned down.

Teachings, suggestions, and implementation manners of other methods for operating the circuit of the electronic apparatus 300 can be sufficiently derived from the descriptions of the previous embodiments as shown in FIG. 2 to FIG. 5 and are thus will not be repeated below.

Figure 10:
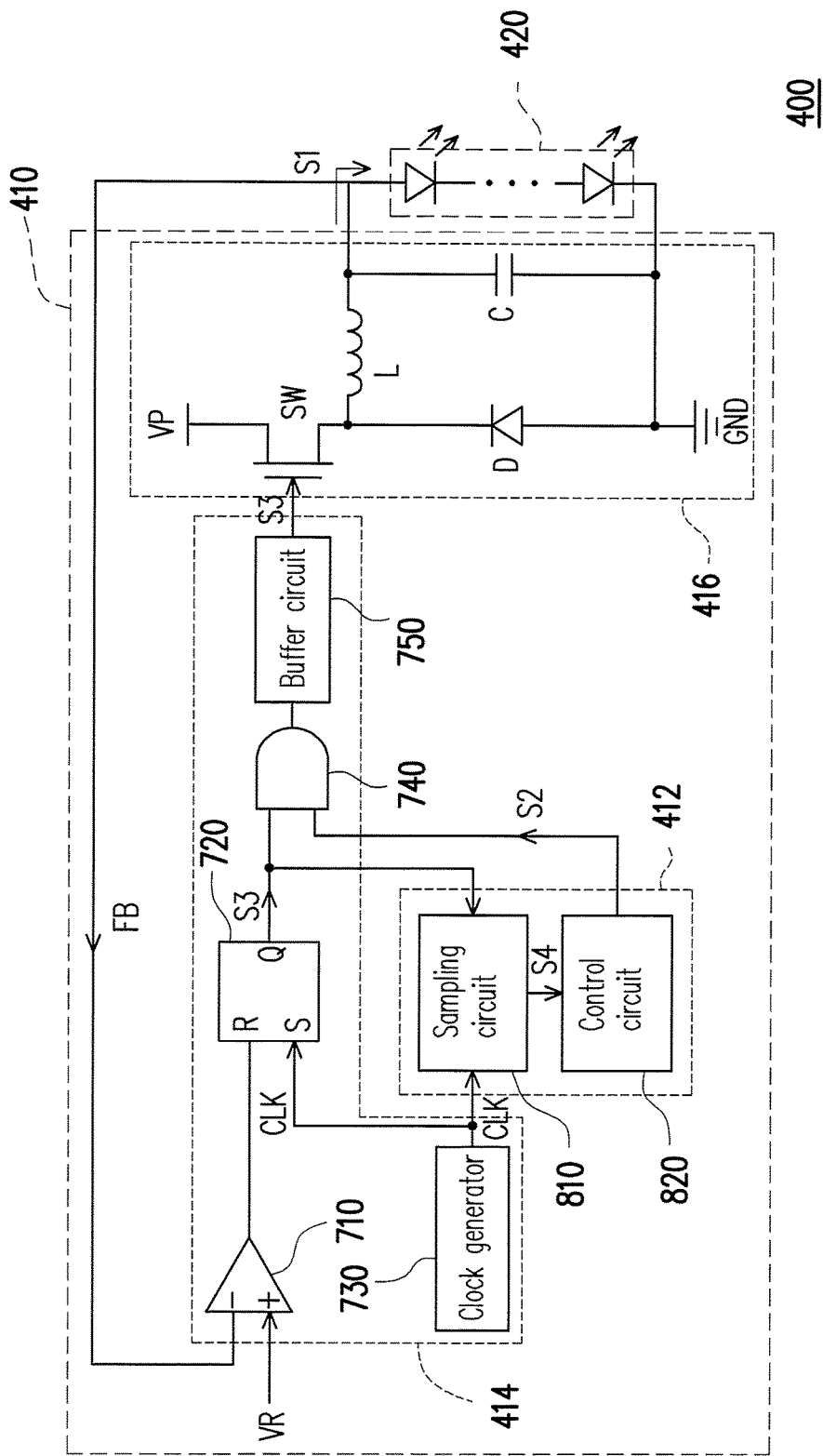
FIG. 10 is schematic view of an electronic apparatus according to another exemplary embodiment.

FIG. 10 is schematic view of an electronic apparatus according to another exemplary embodiment. With reference to FIG. 6 and FIG. 10, the electronic apparatus 400 described in the present embodiment is similar to the electronic apparatus 300 illustrated in FIG. 6, while the main difference therebetween lies in the manner of designing the circuit structure inside the power converter circuit, for instance. Particularly, in the present exemplary embodiment, the inductor L, the light-emitting diode D, the capacitor C, and the load 420 constitute an electrical loop coupled between the ground voltage GND and the switch SW. The voltage at a terminal of the load 420 acts as the feedback signal FB and is transmitted to the comparator 710 of the signal generating circuit 410, so as to compare the levels of the signals. According to the present exemplary embodiment, if the pulse width of the control signal S3 is less than the predetermined width range, it indicates that the load 420 is an open circuit. On the contrary, if the pulse width of the control signal S3 is greater than the predetermined width range, it indicates that the load 420 is a short circuit. That is, as provided herein, the overly large or small pulse width of the control signal S3 in comparison with to the predetermined width range represents different circuit abnormalities according to different manner of designing the circuit structure inside the power converter circuit 416.

Teachings, suggestions, and implementation manners of other methods for operating the circuit of the electronic apparatus 400 can be sufficiently derived from the descriptions of the previous embodiments as shown in FIG. 2 to FIG. 9 and are thus will not be repeated below.

Figure 11:
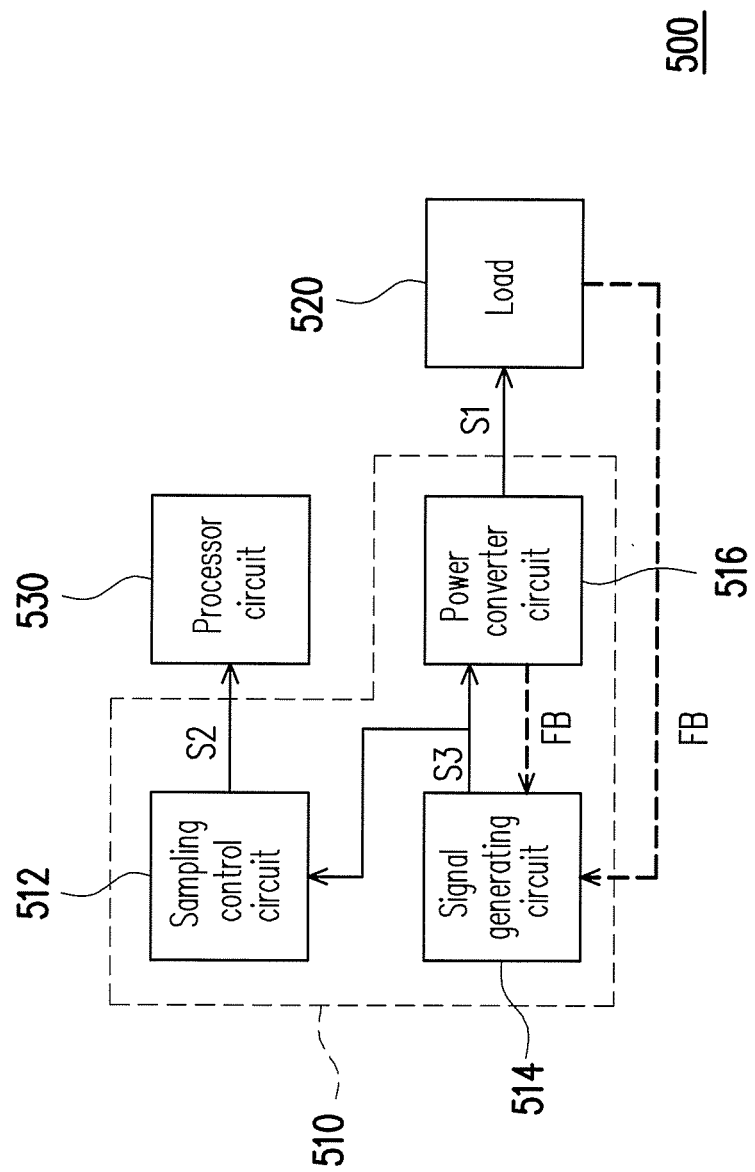
FIG. 11 is schematic view of an electronic apparatus according to another exemplary embodiment.

FIG. 11 is schematic view of an electronic apparatus according to another exemplary embodiment. With reference to FIG. 1 and FIG. 11, the electronic apparatus 500 described in the present embodiment is similar to the electronic apparatus 100 illustrated in FIG. 1, while the main difference therebetween lies in that the driving power generating circuit 510 outputs the lock signal S2 as a warning signal to the processor circuit 530, so as to indicate whether the load 520 is an open circuit or a short circuit, for instance.

In the present exemplary embodiment, the sampling control circuit 512 is configured to sample the control signal S3, so as to determine the electrical condition of the load 520, i.e., whether the load 520 is an open circuit or a short circuit or functions normally. The sampling control circuit 512 then outputs the lock signal S2 to the processor circuit 530 according to the sampling result S4, and the lock signal S2 acts as a warning signal to indicate whether the load 520 is an open circuit or a short circuit. After receiving the lock signal S2, the processor circuit 530 may determine whether the load 520 is an open circuit/a short circuit or not, so as to process the driving power generating circuit 510 through stopping its operation and preventing the driving power generating circuit 510 from being overheated or burned down, for instance.

In the present exemplary embodiment, the processor circuit 530 may be an external processor outside the electronic apparatus 500 or an internal processor installed in the electronic apparatus 500. The processor circuit 530 provided herein includes, for instance, a central processing unit (CPU), any other general or specific programmable microprocessor, any other digital signal processor (DSP), any other programmable controller, any other application specific integrated circuit (ASIC), any other programmable logic device (PLD), any other similar device, or a combination thereof, which should not be construed as limitations to the disclosure.

Teachings, suggestions, and implementation manners of other methods for operating the circuit of the electronic apparatus 500 can be sufficiently derived from the descriptions of the previous embodiments as shown in FIG. 1 to FIG. 10 and are thus will not be repeated below.

Figure 12:
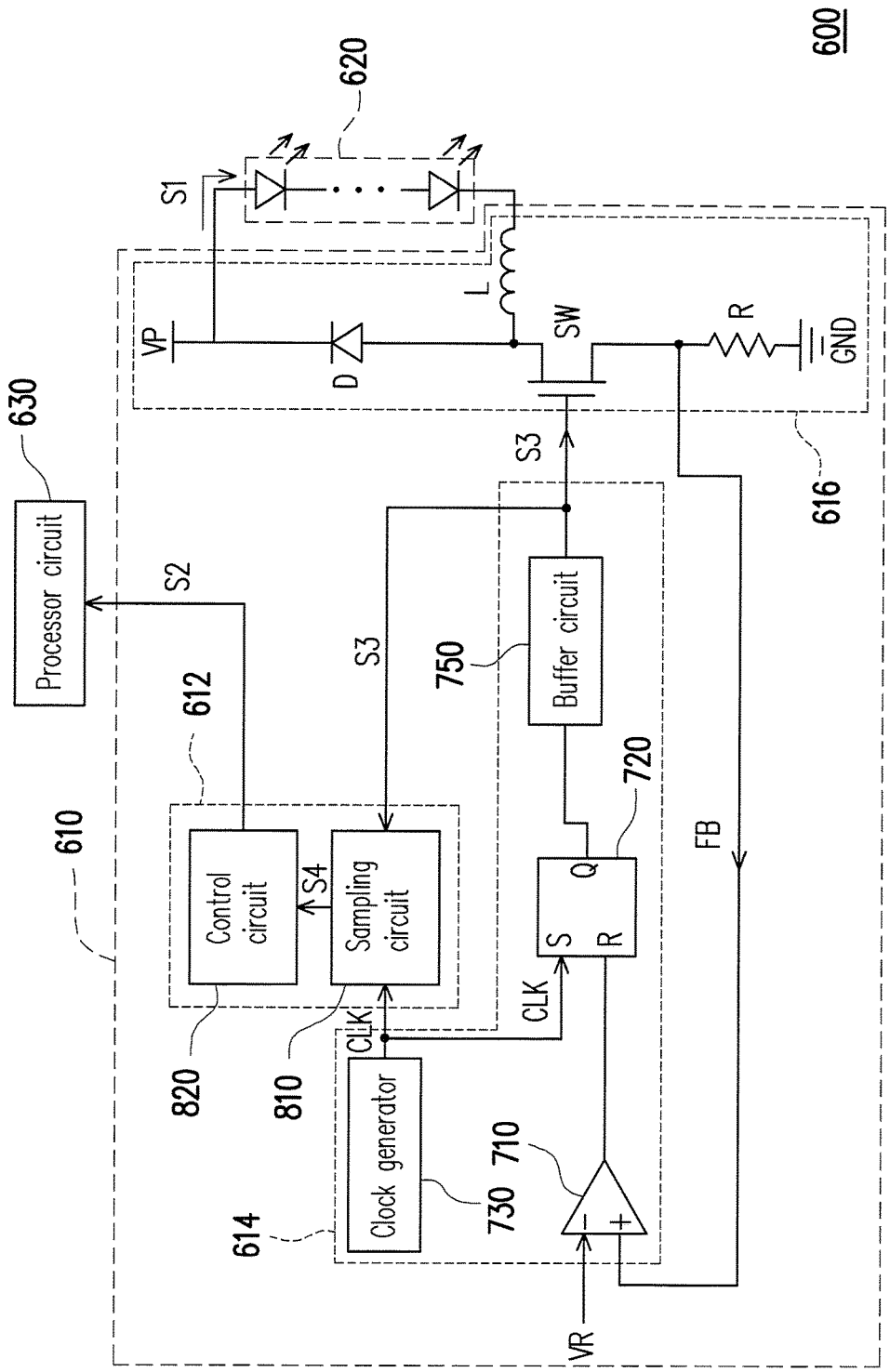
FIG. 12 is schematic view of an electronic apparatus according to another exemplary embodiment.

FIG. 12 is schematic view of an electronic apparatus according to another exemplary embodiment. With reference to FIG. 2 and FIG. 12, the electronic apparatus 600 described in the present embodiment is similar to the electronic apparatus 200 illustrated in FIG. 12, while the main difference therebetween lies in that the driving power generating circuit 610 outputs the lock signal S2 as a warning signal to the processor circuit 630, so as to indicate whether the load 620 is an open circuit or a short circuit, for instance.

In the present exemplary embodiment, the sampling circuit 810 is configured to sample the control signal S3 output by the buffer circuit 750, so as to determine the electrical condition of the load 620, i.e., whether the load 620 is an open circuit or a short circuit or functions normally. The control circuit 820 then outputs the lock signal S2 to the processor circuit 630 according to the sampling result S4, and the lock signal S2 acts as a warning signal to indicate whether the load 620 is an open circuit or a short circuit. After receiving the lock signal S2, the processor circuit 630 may determine whether the load 620 is an open circuit/a short circuit or not, so as to process the driving power generating circuit 610 through stopping its operation and preventing the driving power generating circuit 610 from being overheated or burned down, for instance. In the present exemplary embodiment, the sampling circuit 810 samples the control signal S3 output by the buffer circuit 750, for instance, which should however not be construed as a limitation to the disclosure. In another exemplary embodiment, the sampling circuit 810 may also sample the control signal S3 output by the SR flip-flop 720.

Teachings, suggestions, and implementation manners of other methods for operating the circuit of the electronic apparatus 600 can be sufficiently derived from the descriptions of the previous embodiments as shown in FIG. 1 to FIG. 11 and are thus will not be repeated below.

Figure 13:
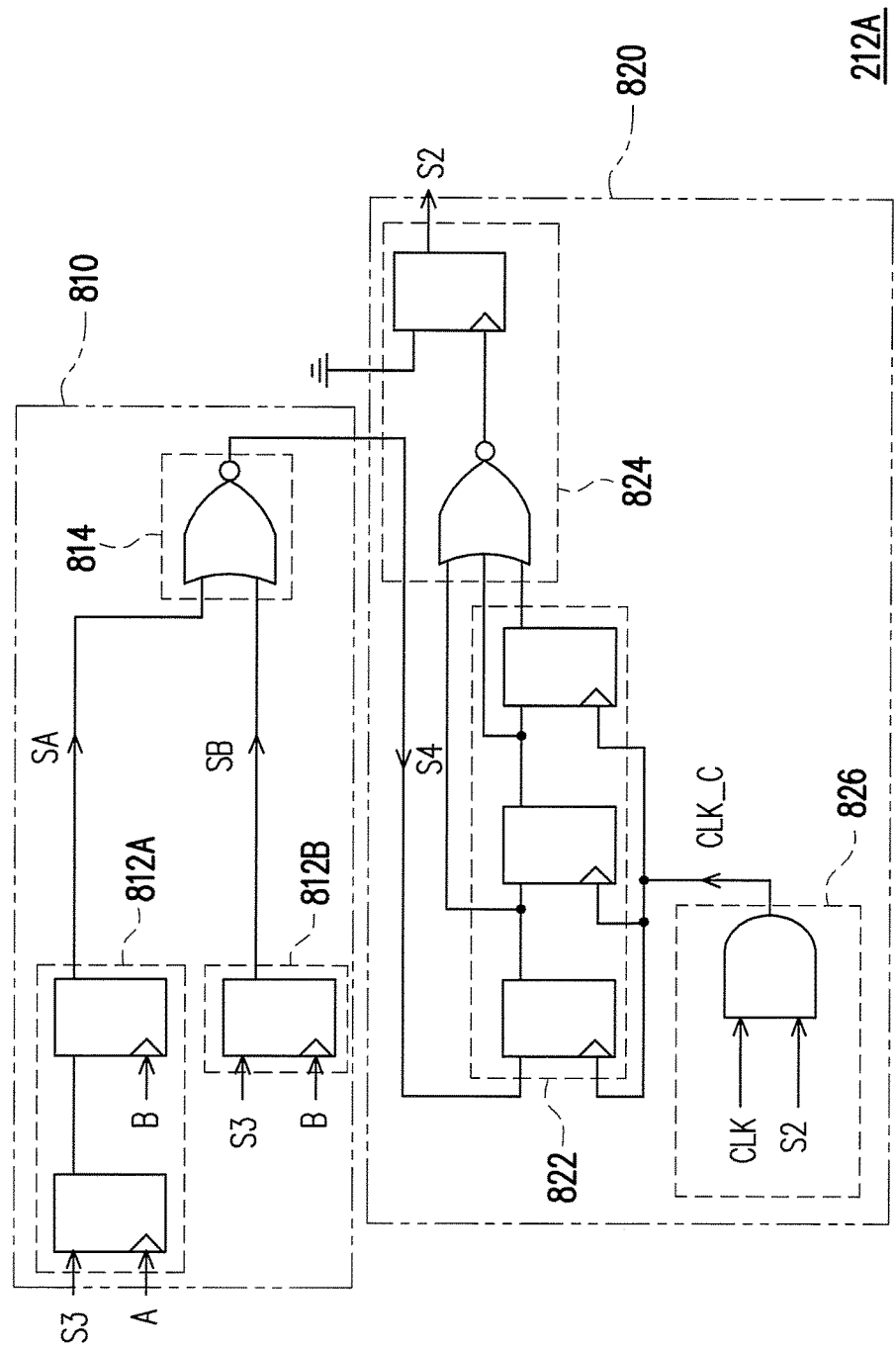
FIG. 13 is schematic view of a sampling control circuit according to an exemplary embodiment.
Figure 14:
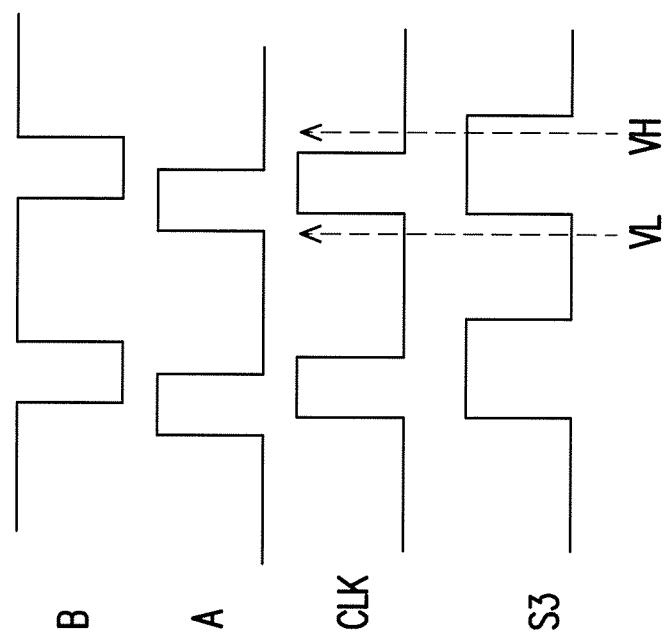
FIG. 14 schematically illustrates waveforms of signals of a sampling control circuit while the sampling control circuit performs a sampling function according to an exemplary embodiment.

FIG. 13 is schematic view of a sampling control circuit according to an exemplary embodiment. FIG. 14 schematically illustrates waveforms of signals of a sampling control circuit while the sampling control circuit performs a sampling function according to an exemplary embodiment. With reference to FIG. 2, FIG. 13, and FIG. 14, the sampling control circuit 212A provided herein includes a sampling circuit 810 and a control circuit 820, for instance. As provided herein, the sampling circuit 810 is configured to sample the control signal S3 and determine whether the pulse width of the control signal S3 is less than the predetermined width range according to the sampling result S4, for instance. If the pulse width of the control signal S3 is less than the predetermined width range, it indicates that the load 20 is a short circuit. The control circuit 820 then counts the number of times of the pulse width of the control signal S3 being less than the predetermined width range and determines whether the number of times is greater than or equal to a predetermined value. If the number of times is greater than or equal to the predetermined value, the control circuit 820 outputs the lock signal S2 to the signal generating circuit 216 to control the power converter circuit 216 to stop its operation or outputs the lock signal S2 to the processor circuit to indicate that the load 220 is a short circuit.

Specifically, in the present exemplary embodiment, the sampling circuit 810 includes a first sampling channel 812A, a second sampling channel 812B, and a first logic circuit 814. The first sampling channel 812A and the second sampling channel 812B are electrically connected to the signal generating circuit 214. The first logic circuit 814 is electrically connected to the first sampling channel 812A and the second sampling channel 812B. In the present exemplary embodiment, the first sampling channel 812A is configured to sample the control signal S3 according to a first sampling reference signal A and a second sampling reference signal B, so as to output a first sampling signal SA to the first logic circuit 814. The second sampling channel 812B is configured to sample the control signal S3 according to the second sampling reference signal B, so as to output a second sampling signal SB to the first logic circuit 814. The first logic circuit 814 is configured to output the sampling result S4 to the control circuit 820 according to the first sampling signal SA and the second sampling signal SB. In the present exemplary embodiment, the first logic circuit 814 includes an NOR gate for performing logic computation on the first sampling signal SA and the second sampling signal SB, for instance, which should however not be construed as a limitation to the disclosure.

Here, the first sampling reference signal A and the second sampling reference signal B are determined according to the clock signal CLK, for instance. A rising edge of the first sampling reference signal A is slightly ahead of a rising edge of the clock signal CLK in terms of timing sequence, for instance. The second sampling reference signal B may be obtained after inverting the clock signal CLK, and the rising edge of the clock signal CLK slightly falls behind the falling edge of the clock signal CLK in terms of timing sequence, for instance. In the present exemplary embodiment, the first sampling channel 812A and the second sampling channel 812B respectively sample the control signal S3 at the rising edge of the first sampling reference signal A and the rising edge of the second sampling reference signal B, as shown in FIG. 14, and the reference symbols VL and VH respectively represent the sampling result S4 of the low-level control signal S3 earlier-obtained by the sampling circuit 810 and the high-level control signal S3 later obtained by the sampling circuit 810, for instance. According to the sampling result S4, the pulse width of the control signal S3 is substantially equal to the predetermined width range. At this time, the load 220 functions normally, and the first logic circuit 814 outputs the sampling result S4 with the first logic value (e.g., 1) to the control circuit 820, for instance. By contrast, if the load 220 is a short circuit, the sampling result S4 of the first and second sampling channels 812A and 812B is as shown in FIG. 4 or FIG. 8, for instance, and the pulse width of the control signal S3 is less than the predetermined width range. At this time, the first logic circuit 814 outputs the sampling result S4 with the second logic value (e.g., 0) to the control circuit 820, for instance.

From another perspective, in the present embodiment, the control circuit 820 includes a counter circuit 822, a second logic circuit 824, and a third logic circuit 826. The counter circuit 822 is electrically connected to the sampling circuit 810. The second logic circuit 824 and the third logic circuit 826 are electrically connected to the counter circuit 822, respectively. In the present exemplary embodiment, the third logic circuit 826 is configured to provide a counter reference signal CLK_C. The counter circuit 822 counts the number of times of the pulse width of the control signal S3 being less than the predetermined width range according to the counter reference signal CLK_C. The second logic circuit 824 then determines whether the number of times of the pulse width of the control signal S3 being less than the predetermined width range is greater than or equal to a predetermined value. If the number of times of the pulse width of the control signal S3 being less than the predetermined width range is greater than or equal to the predetermined value, the second logic circuit 824 outputs the lock signal S2 to the signal generating circuit 216 or the processor circuit 530. In the present exemplary embodiment, the counter circuit 822 includes three counters composed of three shift registers, while the number and the type of the counters do not serve to limit the scope of protection provided in the disclosure. Hence, if the number of times of the pulse width of the control signal S3 being less than the predetermined width range is greater than 3, the second logic circuit 824 outputs the lock signal S2 to the signal generating circuit 216 or the processor circuit 530. In other words, the predetermined value provided herein is determined by the number of the counters (i.e., the shift registers).

Besides, in the present embodiment, the third logic circuit 824 provides the count reference signal CLK_C according to the clock signal CLK and the lock signal S2, such that the counter circuit 822 can count the number of times of the pulse width of the control signal S3 being less than the predetermined width range. However, the disclosure is not limited thereto. In an exemplary embodiment, the third logic circuit 826 may determine whether to provide the count reference signal CLK_C to the counter circuit 822 according to an over temperature protection (OTP) signal CLK or a PWM signal.

In the present exemplary embodiment, the electronic apparatus 200 depicted in FIG. 2 is taken for example, but the disclosure is not limited thereto. The operation of the sampling circuit 810 and the operation of the control circuit 820 are applicable to other electronic apparatuses according to other exemplary embodiments. Moreover, the circuit structures of the sampling circuit 810 and the control circuit 820 provided herein are exemplary and should not be construed as limitations to the disclosure.

Figure 15:
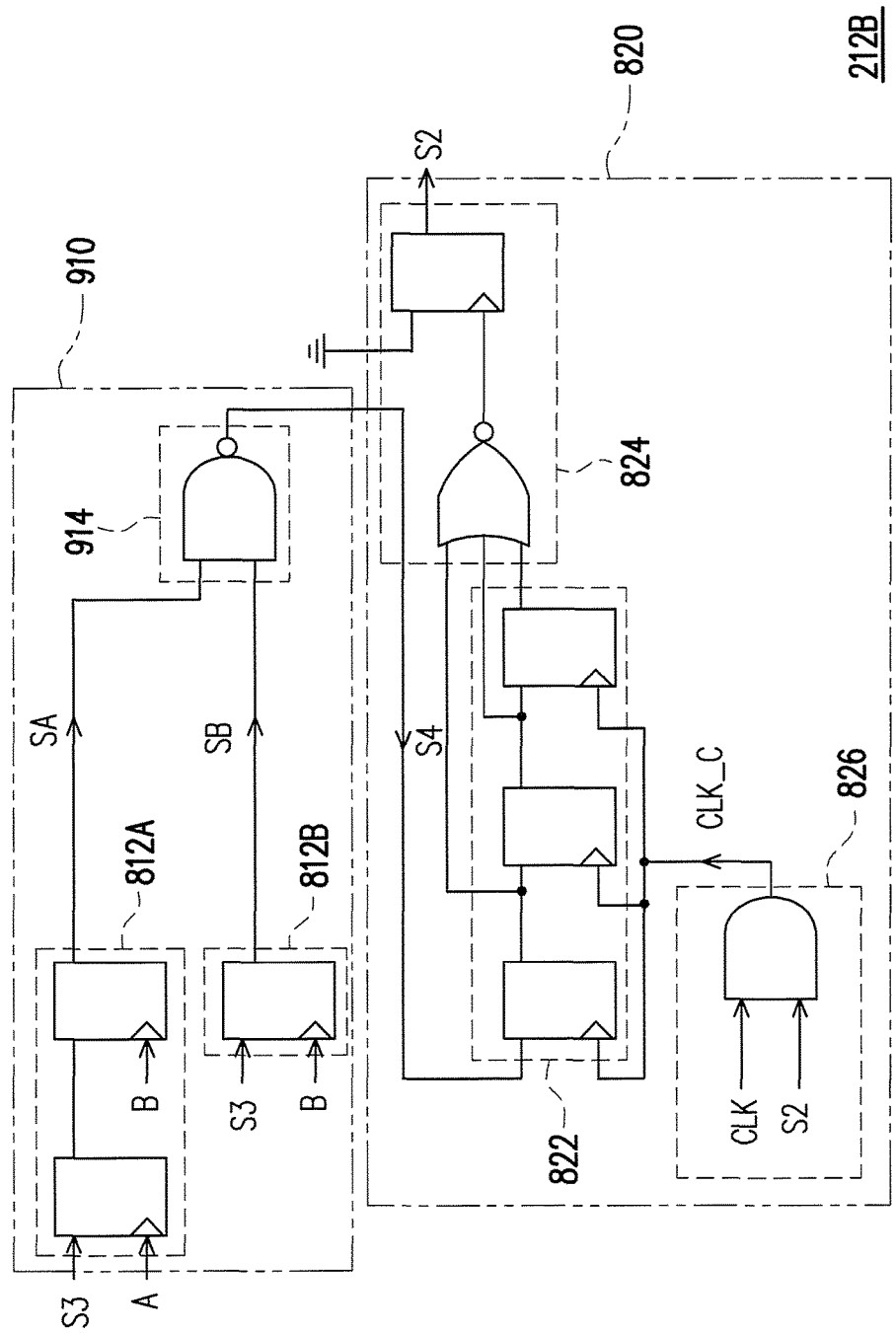
FIG. 15 is schematic view of a sampling control circuit according to another exemplary embodiment.

FIG. 15 is schematic view of a sampling control circuit according to another exemplary embodiment. With reference to FIG. 2, FIG. 13, and FIG. 15, the sampling control circuit 212B provided in the present exemplary embodiment is similar to the sampling control circuit 212A depicted in FIG. 13, whereas the main difference therebetween lies in the fact that the sampling control circuit 212B determines whether the pulse width of the control signal S3 is greater than the predetermined width range according to the sampling result S4, for instance. If the pulse width of the control signal S3 is greater than the predetermined width range, it indicates that the load 20 is an open circuit.

Specifically, the sampling control circuit 212B provided herein includes a sampling circuit 910 and a control circuit 820, for instance. As provided herein, the sampling circuit 910 is configured to sample the control signal S3 and determine whether the pulse width of the control signal S3 is greater than the predetermined width range according to the sampling result S4, for instance. If the pulse width of the control signal S3 is greater than the predetermined width range, it indicates that the load 20 is an open circuit. The control circuit 820 then counts the number of times of the pulse width of the control signal S3 being greater than the predetermined width range and determines whether the number of times is greater than or equal to a predetermined value. If the number of times is greater than or equal to the predetermined value, the control circuit 820 outputs the lock signal S2 to the signal generating circuit 216 to control the power converter circuit 216 to stop its operation or outputs the lock signal S2 to the processor circuit to indicate that the load 220 is an open circuit.

In the present exemplary embodiment, the first logic circuit 914 outputs the sampling result S4 to the control circuit 820 according to the first sampling signal SA and the second sampling signal SB. In the present exemplary embodiment, the first logic circuit 914 includes an NAND gate for performing logic computation on the first sampling signal SA and the second sampling signal SB, for instance, which should however not be construed as a limitation to the disclosure. When the load 220 functions normally, the first logic circuit 914 outputs the sampling result S4 with the first logic value (e.g., 1) to the control circuit 820, for instance. By contrast, if the load 220 is an open circuit, the sampling result S4 of the first and second sampling channels 812A and 812B is as shown in FIG. 5 or FIG. 9, for instance, and the pulse width of the control signal S3 is greater than the predetermined width range. At this time, the first logic circuit 914 outputs the sampling result S4 with the second logic value (e.g., 0) to the control circuit 820, for instance.

In the present exemplary embodiment, the counter circuit 822 counts the number of times of the pulse width of the control signal S3 being greater than the predetermined width range according to the counter reference signal CLK_C. The second logic circuit 824 then determines whether the number of times of the pulse width of the control signal S3 being greater than the predetermined width range is greater than or equal to a predetermined value. If the number of times of the pulse width of the control signal S3 being greater than the predetermined width range is greater than or equal to the predetermined value, the second logic circuit 824 outputs the lock signal S2 to the signal generating circuit 216 or the processor circuit 530.

In the present exemplary embodiment, the electronic apparatus 200 depicted in FIG. 2 is taken for example, but the disclosure is not limited thereto. The operation of the sampling circuit 910 and the operation of the control circuit 820 are also applicable to other electronic apparatuses according to other exemplary embodiments. Moreover, the circuit structures of the sampling circuit 910 and the control circuit 820 provided herein are exemplary and should not be construed as limitations to the disclosure.

Figure 16:
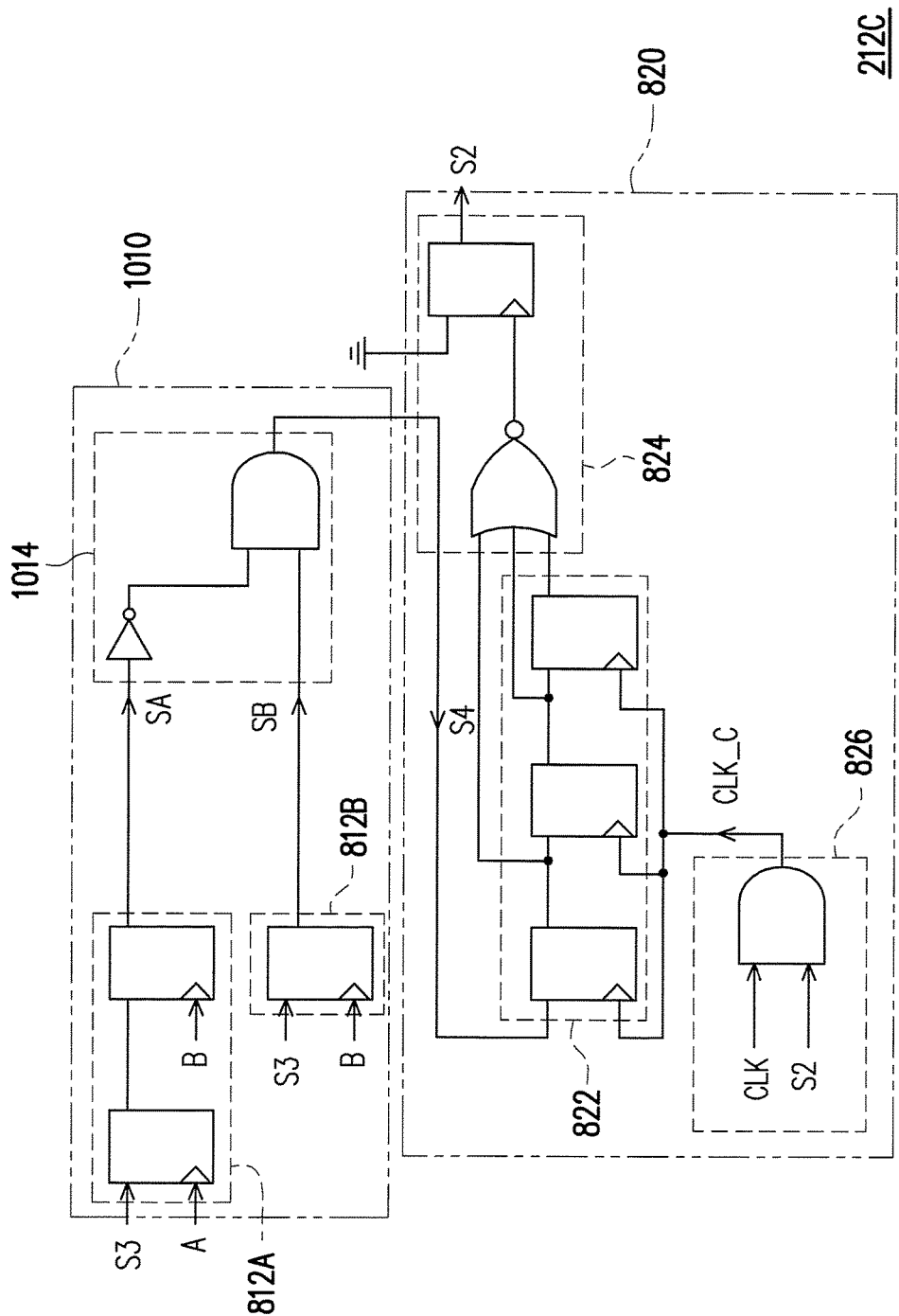
FIG. 16 is schematic view of a sampling control circuit according to another exemplary embodiment.

FIG. 16 is schematic view of a sampling control circuit according to another exemplary embodiment. With reference to FIG. 2, FIG. 13, and FIG. 16, the sampling control circuit 212C provided in the present exemplary embodiment is similar to the sampling control circuit 212A depicted in FIG. 13, whereas the main difference therebetween lies in the fact that the sampling control circuit 212C determines whether the pulse width of the control signal S3 is greater than or less than the predetermined width range according to the sampling result S4, for instance. If the pulse width of the control signal S3 is greater than or less than the predetermined width range, it indicates that the load 20 is an open circuit or a short circuit.

Specifically, the sampling control circuit 212C provided herein includes a sampling circuit 1010 and a control circuit 820, for instance. As provided herein, the sampling circuit 1010 is configured to sample the control signal S3 and determine whether the pulse width of the control signal S3 is greater than or less than the predetermined width range according to the sampling result S4, for instance. If the pulse width of the control signal S3 is greater than or less than the predetermined width range, it indicates that the load 20 is an open circuit or a short circuit. The control circuit 820 then counts the number of times of the pulse width of the control signal S3 being greater than or less than the predetermined width range and determines whether the number of times is greater than or equal to a predetermined value. If the number of times is greater than or equal to the predetermined value, the control circuit 820 outputs the lock signal S2 to the signal generating circuit 216 to control the power converter circuit 216 to stop its operation or outputs the lock signal S2 to the processor circuit to indicate that the load 220 is a short circuit or an open circuit.

In the present exemplary embodiment, the first logic circuit 1014 outputs the sampling result S4 to the control circuit 820 according to the first sampling signal SA and the second sampling signal SB. In the present exemplary embodiment, the first logic circuit 1014 includes an inverter and an AND gate for performing logic computation on the first sampling signal SA and the second sampling signal SB, for instance, which should however not be construed as a limitation to the disclosure. When the load 220 functions normally, the first logic circuit 1014 outputs the sampling result S4 with the first logic value (e.g., 1) to the control circuit 820, for instance. By contrast, if the load 220 is an open circuit or a short circuit, the sampling result S4 of the first and second sampling channels 812A and 812B is as shown in FIG. 4, FIG. 5, FIG. 8, or FIG. 9, for instance, and the pulse width of the control signal S3 is greater than or less than the predetermined width range. At this time, the first logic circuit 814 outputs the sampling result S4 with the second logic value (e.g., 0) to the control circuit 820, for instance.

In the present exemplary embodiment, the counter circuit 822 counts the number of times of the pulse width of the control signal S3 being greater than or less than the predetermined width range according to the counter reference signal CLK_C. The second logic circuit 824 then determines whether the number of times of the pulse width of the control signal S3 being greater than or less than the predetermined width range is greater than or equal to a predetermined value. If the number of times of the pulse width of the control signal S3 being greater than or less than the predetermined width range is greater than or equal to the predetermined value, the second logic circuit 824 outputs the lock signal S2 to the signal generating circuit 216 or the processor circuit 530.

In the present exemplary embodiment, the electronic apparatus 200 depicted in FIG. 2 is taken for example, but the disclosure is not restricted here. The operation of the sampling circuit 1010 and the operation of the control circuit 820 are also applicable to other electronic apparatuses according to other exemplary embodiments. Moreover, the circuit structures of the sampling circuit 1010 and the control circuit 820 provided herein are exemplary and should not be construed as limitations to the disclosure.

Figure 17:
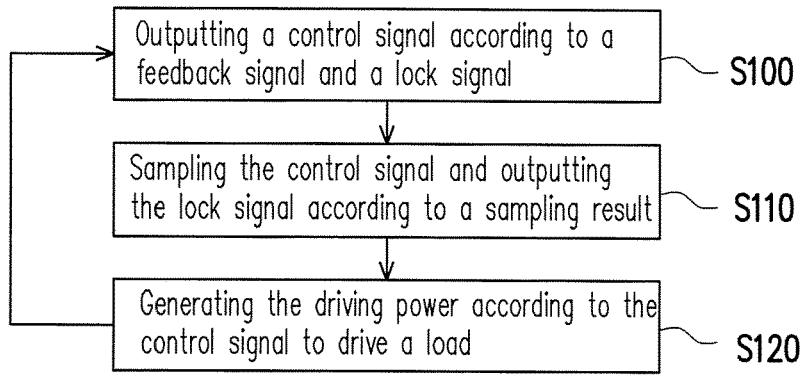
FIG. 17 is a flowchart of a method for generating a driving power according to an exemplary embodiment.

FIG. 17 is a flowchart of a method for generating a driving power according to an exemplary embodiment. With reference to FIG. 1, FIG. 11, and FIG. 17, the method for generating a driving power as provided herein is at least applicable to the driving power generating circuit 100 depicted in FIG. 1 or the driving power generating circuit 500 depicted in FIG. 11, for instance. In the present exemplary embodiment, the driving power generating circuit 100 depicted in FIG. 1 is taken for instance; in step S100, the driving power generating circuit 100 outputs the control signal S3 to the power converter circuit 116 according to the feedback signal FB and the lock signal S2. In step S110, the sampling control circuit 112 of the driving power generating circuit 100 is configured to sample the control signal S3 and output the lock signal S2 to the signal generating circuit 114 according to the sampling result S4. In step S120, the power converter circuit 116 of the driving power generating circuit 100 is configured to generate the driving power S1 according to the control signal S3 to drive the load 120. After that, back to step S100, the driving power generating circuit 100 again outputs the control signal S3 to the power converter circuit 116 according to the feedback signal FB and the lock signal S2, so as to continuously perform the method of generating the driving power as provided in the present exemplary embodiment.

Teachings, suggestions, and implementation manners of the method for generating the driving power as provided herein can be sufficiently derived from the descriptions of the previous embodiments as shown in FIG. 1 to FIG. 16 and are thus will not be repeated below.

Figure 18:
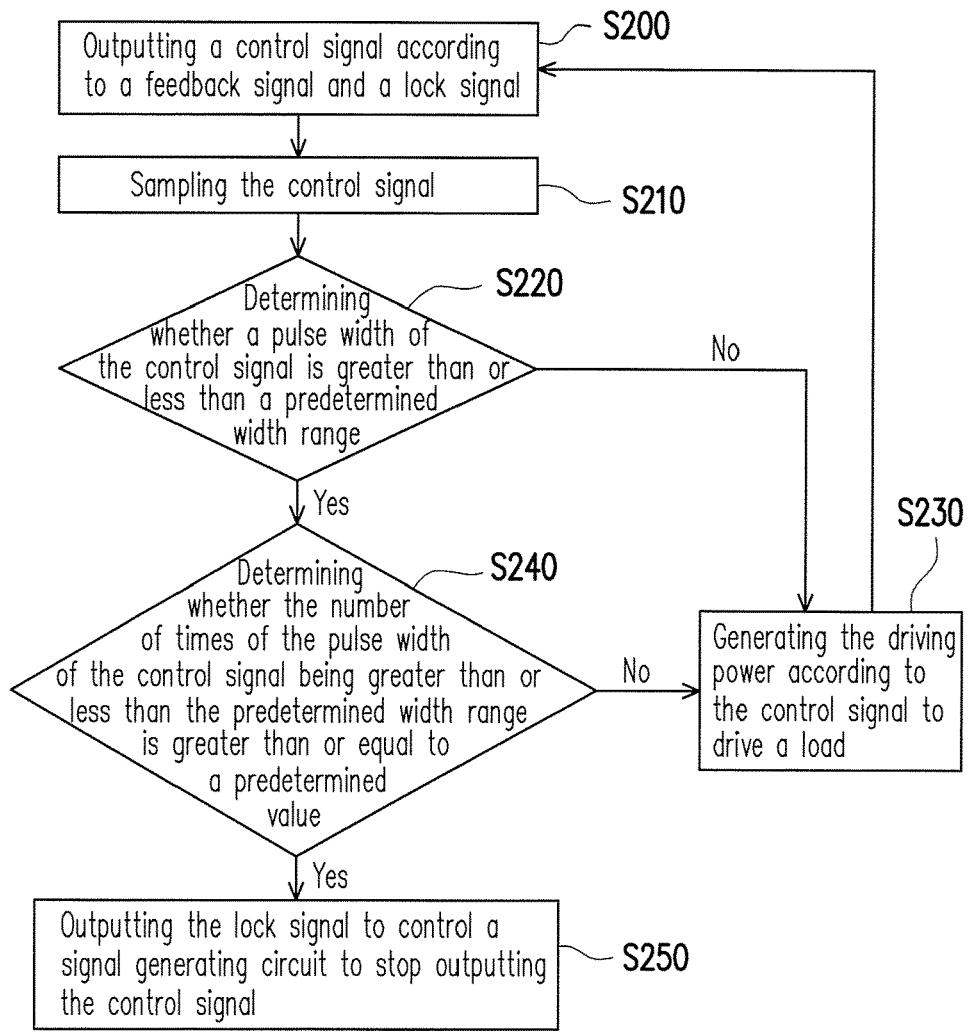
FIG. 18 is a flowchart of a method for generating a driving power according to an exemplary embodiment.

FIG. 18 is a flowchart of a method for generating a driving power according to an exemplary embodiment. With reference to FIG. 1 and FIG. 18, the method for generating a driving power as provided herein is at least applicable to the driving power generating circuit 100 depicted in FIG. 1, for instance. In the present exemplary embodiment, the driving power generating circuit 100 depicted in FIG. 1 is taken for example; in step S200, the driving power generating circuit 100 outputs the control signal S3 to the power converter circuit 116 according to the feedback signal FB and the lock signal S2. In step S210, the sampling control circuit 112 of the driving power generating circuit 100 is configured to sample the control signal S3. In step S220, the sampling control circuit 112 of the driving power generating circuit 100 is configured to determine whether the pulse width of the control signal S3 is greater than or less than the predetermined width range according to the sampling result S4.

According to the present exemplary embodiment, if the pulse width of the control signal S3 is neither greater than nor less than the predetermined width range, the power converter circuit 116 of the driving power generating circuit 100 is configured to generate the driving power S1 according to the control signal S3 in step S230 to drive the load 120. After that, back to step S200, the driving power generating circuit 100 again outputs the control signal S3 to the power converter circuit 116 according to the feedback signal FB and the lock signal S2, so as to continuously perform the method of generating the driving power as provided in the present exemplary embodiment. According to the present exemplary embodiment, if the pulse width of the control signal S3 is greater than or less than the predetermined width range, the sampling control circuit 112 of the driving power generating circuit 100 is configured to determine whether the number of times of the pulse width of the control signal S3 being greater than or less than the predetermined width range is greater than or equal to a predetermined value in step S240.

According to the present exemplary embodiment, if the number of times of the pulse width of the control signal S3 being greater than or less than the predetermined width range is neither greater than nor equal to a predetermined value, the power converter circuit 116 of the driving power generating circuit 100 is configured to generate the driving power S1 according to the control signal S3 in step S230 to drive the load 120. After that, back to step S200, the driving power generating circuit 100 again outputs the control signal S3 to the power converter circuit 116 according to the feedback signal FB and the lock signal S2, so as to continuously perform the method of generating the driving power as provided in the present exemplary embodiment.

However, if the number of times of the pulse width of the control signal S3 being greater than or less than the predetermined width range is greater than or equal to a predetermined value, the sampling control circuit 112 of the driving power generating circuit 100 is configured to output the lock signal S2 to the signal generating circuit 114 and thereby control the signal generating circuit 114 to stop outputting the control signal S3 to the power converter circuit 116 in step S250. As such, the driving power generating circuit 110 that is continuously operated when the load 120 is an open circuit or a short circuit can be prevented from being overheated or burned down.

According to the present exemplary embodiment, in step S220, the sampling control circuit 112 determines whether the pulse width of the control signal S3 is greater than or less than the predetermined width range; in step S240, the sampling control circuit 112 determines whether the number of times of the pulse width of the control signal S3 being greater than or less than the predetermined width range is greater than or equal to the predetermined value. However, the disclosure should not be limited thereto. According to an exemplary embodiment, the sampling control circuit 112 may determine whether the pulse width of the control signal S3 is less than the predetermined width range and determine whether the number of times of the pulse width of the control signal S3 being less than the predetermined width range is greater than or equal to the predetermined value. Alternatively, in an exemplary embodiment, the sampling control circuit 112 may determine whether the pulse width of the control signal S3 is greater than the predetermined width range and determine whether the number of times of the pulse width of the control signal S3 being greater than the predetermined width range is greater than or equal to the predetermined value.

According to the present exemplary embodiment, in step S250, the sampling control circuit 112 outputs the lock signal S2 to the signal generating circuit 114, so as to control the signal generating circuit 114 to stop outputting the control signal S3 to the power converter circuit 116; however, the disclosure is not limited thereto. In an exemplary embodiment, the lock signal S2 may act as a warning signal, for instance, and the sampling control circuit 112 outputs the lock signal S2 to a processor circuit to indicate whether the load is an open circuit or a short circuit.

Teachings, suggestions, and implementation manners of the method for generating the driving power can be sufficiently derived from the descriptions of the previous embodiments as shown in FIG. 1 to FIG. 16 and are thus will not be repeated below.

To sum up, according to the exemplary embodiments provided herein, the sampling control circuit is configured to sample the control signal, and the sampling result includes the information of the pulse width of the control signal. The sampling control circuit determines whether the load functions normally, is an open circuit, or is a short circuit according to the sampling result, so as to output the lock signal to the signal generating circuit or the processor circuit. As such, the driving power generating circuit that is continuously operated when the load is an open circuit or a short circuit can be prevented from being overheated or burned down.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A driving power generating circuit configured to generate a driving power to drive a load, the driving power generating circuit comprising:
a signal generating circuit configured to output a control signal according to a feedback signal and a lock signal;
a power converter circuit electrically connected to the signal generating circuit and configured to generate the driving power according to the control signal to drive the load; and
a sampling control circuit electrically connected to the signal generating circuit and configured to sample the control signal and output the lock signal according to a sampling result,
wherein the sampling control circuit samples the control signal to obtain a pulse width of the control signal, and if the pulse width of the control signal is greater than or less than a predetermined width range, the sampling control circuit outputs the lock signal,
wherein the signal generating circuit further outputs the control signal according to a clock signal, and the predetermined width range is determined according to the clock signal.

2. The driving power generating circuit of claim 1, wherein the sampling control circuit outputs the lock signal to the signal generating circuit, and the signal generating circuit controls the power converter circuit to stop operation according to the lock signal.

3. The driving power generating circuit of claim 1, wherein the lock signal acts as a warning signal, and the sampling control circuit outputs the lock signal to a processor circuit to indicate whether the load is an open circuit or a short circuit.

4. The driving power generating circuit of claim 1, wherein if the load is an open circuit, the pulse width of the control signal is greater than the predetermined width range, and if the load is a short circuit, the pulse width of the control signal is less than the predetermined width range.

5. The driving power generating circuit of claim 1, wherein if the load is an open circuit, the pulse width of the control signal is less than the predetermined width range, and if the load is a short circuit, the pulse width of the control signal is greater than the predetermined width range.

6. The driving power generating circuit of claim 1, wherein if the number of times of the pulse width of the control signal being greater than or less than the predetermined width range is greater than or equal to a predetermined value, the sampling control circuit outputs the lock signal.

7. The driving power generating circuit of claim 1, wherein the sampling control circuit comprises:
a sampling circuit electrically connected to the signal generating circuit and configured to sample the control signal; and
a control circuit electrically connected to the sampling circuit and configured to output the lock signal according to the sampling result.

8. The driving power generating circuit of claim 7, wherein the sampling circuit comprises:
a first sampling channel electrically connected to the signal generating circuit and configured to sample the control signal according to a first sampling reference signal, so as to output a first sampling signal;
a second sampling channel electrically connected to the signal generating circuit and configured to sample the control signal according to a second sampling reference signal, so as to output a second sampling signal; and
a first logic circuit electrically connected to the first sampling channel and the second sampling channel and configured to output the sampling result to the control circuit according to the first sampling signal and the second sampling signal.

9. The driving power generating circuit of claim 8, wherein the signal generating circuit further outputs the control signal according to the clock signal, and the first sampling reference signal and the second sampling reference signal are determined according to the clock signal.

10. The driving power generating circuit of claim 7, wherein the sampling result comprises the pulse width of the control signal being greater than or less than the predetermined width range, and the control circuit comprises:
a counter circuit electrically connected to the sampling circuit and configured to count the number of times of the pulse width of the control signal being greater than or less than the predetermined width range according to a counter reference signal; and
a second logic circuit electrically connected to the counter circuit, wherein if the number of times of the pulse width of the control signal being greater than or less than the predetermined width range is greater than or equal to a predetermined value, the second logic circuit outputs the lock signal.

11. The driving power generating circuit of claim 10, wherein the signal generating circuit further outputs the control signal according to the clock signal, and the control circuit further comprises:
a third logic circuit electrically connected to the counter circuit and configured to provide the counter reference signal according to the clock signal and the lock signal.

12. The driving power generating circuit of claim 10, wherein the counter circuit comprises a plurality of counters, and the predetermined value is determined according to the number of the counters.

13. A method for generating a driving power to drive a load, the method comprising:
outputting a control signal according to a feedback signal, a lock signal and a clock signal;
sampling the control signal and outputting the lock signal according to a sampling result, wherein the step of sampling the control signal and outputting the lock signal according to the sampling result comprises:
sampling the control signal to obtain a pulse width of the control signal, and
if the pulse width of the control signal is greater than or less than a predetermined width range, outputting the lock signal, wherein the predetermined width range is determined according to the clock signal; and
generating the driving power according to the control signal to drive the load.

14. The method of claim 13, further comprising stopping outputting the control signal according to the lock signal.

15. The method of claim 13, wherein the lock signal acts as a warning signal, and the method further comprises outputting the lock signal to indicate whether the load is an open circuit or a short circuit.

16. The method of claim 13, wherein if the load is an open circuit, the pulse width of the control signal is greater than the predetermined width range, and if the load is a short circuit, the pulse width of the control signal is less than the predetermined width range.

17. The method of claim 13, wherein if the load is an open circuit, the pulse width of the control signal is less than the predetermined width range, and if the load is a short circuit, the pulse width of the control signal is greater than the predetermined width range.

18. The method of claim 13, wherein in the step of outputting the lock signal, if the number of times of the pulse width of the control signal being greater than or less than the predetermined width range is greater than or equal to a predetermined value, outputting the lock signal.

\* \* \* \* \*